United States Patent
Camarota et al.

(10) Patent No.: US 7,733,159 B1
(45) Date of Patent: Jun. 8, 2010

(54) HIGH VOLTAGE TOLERANCE EMULATION USING VOLTAGE CLAMP FOR OXIDE STRESS PROTECTION

(75) Inventors: Rafael Camarota, Sunnyvale, CA (US); John Costello, Los Altos, CA (US); Myron Wong, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/804,712

(22) Filed: Mar. 18, 2004

(51) Int. Cl.
  *H03K 3/10* (2006.01)
(52) U.S. Cl. .................. 327/534; 327/313; 327/112
(58) Field of Classification Search ............ 327/309, 327/313–314, 318–321, 327–328, 108, 112, 327/310, 534; 361/56, 90, 91.1
  See application file for complete search history.

(56) References Cited

U.S. PATENT DOCUMENTS

| | | | |
|---|---|---|---|
| 5,128,560 A | | 7/1992 | Chern et al. |
| 5,514,893 A | * | 5/1996 | Miyanaga et al. ............ 257/360 |
| 5,767,733 A | * | 6/1998 | Grugett ....................... 327/534 |
| 5,917,367 A | * | 6/1999 | Woo ............................ 327/537 |
| 5,933,047 A | * | 8/1999 | Zhu et al. .................... 327/534 |
| 5,953,261 A | | 9/1999 | Furutani et al. |
| 6,111,455 A | * | 8/2000 | Eleyan et al. ................ 327/534 |
| 6,147,511 A | | 11/2000 | Patel et al. |
| 6,208,167 B1 | | 3/2001 | Ranjan et al. |
| 6,252,422 B1 | | 6/2001 | Patel et al. |
| 6,351,539 B1 | * | 2/2002 | Djakovic ..................... 380/268 |
| 6,359,408 B1 | * | 3/2002 | Tyckowski .................. 318/469 |
| 6,369,613 B1 | | 4/2002 | Costello et al. |
| 6,417,721 B2 | * | 7/2002 | Sher ............................ 327/525 |

(Continued)

FOREIGN PATENT DOCUMENTS

JP       06178445 A    *   6/1994

OTHER PUBLICATIONS

Non-Final Office Action for U.S. Appl. No. 10/794,987, mailed on Sep. 7, 2005, 15 pages.

(Continued)

*Primary Examiner*—Quan Tra
(74) *Attorney, Agent, or Firm*—Townsend and Townsend and Crew LLP

(57) ABSTRACT

Circuits, methods, and apparatus for limiting voltages received by devices in input/output cells to less than the device's breakdown voltage. An exemplary embodiment of the present invention provides an input/output cell having one or more clamp diodes and resistors configured to limit voltages seen by the gates of the devices in the input/output cell. In one embodiment, the clamp diodes are on-chip, while the resistors are off-chip. In a specific embodiment, the clamp diode is connected between an input pad for the input output cell and a supply voltage VCC, while a resistor is off-chip and in series with the input pad. In another specific embodiment, a series of clamp diodes are coupled between ground and an input pad, while a resistor is off-chip and in series with the input pad. In another embodiment, the clamp diode or diodes may be programmably or selectively disconnected. These clamp diodes may be disabled to protect against latch-up. Integrated circuits that are consistent with the present invention may include one or more of these and the other features described.

4 Claims, 7 Drawing Sheets

U.S. PATENT DOCUMENTS

| | | |
|---|---|---|
| 6,433,585 B1 | 8/2002 | Patel et al. |
| 6,525,594 B2 * | 2/2003 | Fugate et al. ............... 327/534 |
| 6,529,359 B1 * | 3/2003 | Verhaege et al. ............ 361/100 |
| 6,552,594 B2 * | 4/2003 | Lin ............................. 327/310 |
| 6,583,646 B1 | 6/2003 | Patel et al. |
| 6,970,024 B1 | 11/2005 | Reese et al. |
| 7,088,140 B1 | 8/2006 | Nguyen et al. |
| 2001/0017755 A1 * | 8/2001 | Toyoshima .................. 361/56 |
| 2002/0017940 A1 * | 2/2002 | Fujii et al. .................. 327/319 |
| 2002/0057105 A1 * | 5/2002 | Kan ............................ 326/58 |
| 2002/0163768 A1 * | 11/2002 | Kwon et al. .................. 361/56 |

OTHER PUBLICATIONS

Response to Non-Final Office Action for U.S. Appl. No. 10/794,987, Filed on Mar. 7, 2006, 20 pages.

Notice of Allowance for U.S. Appl. No. 10/794,987, mailed on Mar. 24, 2006, 7 pages.

Response After Notice of Allowance for U.S. Appl. No. 10/794,987, mailed on Jun. 12, 2006, 11 pages.

* cited by examiner

HIGH VOLTAGE TOLERANCE EMULATION USING VOLTAGE CLAMP FOR OXIDE STRESS PROTECTION

BACKGROUND

The present invention relates to protecting devices in input/output cells from excessive input voltages.

A goal in integrated circuit manufacturing is to increase circuit density and functionality. Accordingly, there has been a great deal of effort put into reducing the size of individual transistors so that more transistors, and thus more functionality, can be placed on each device.

But there is a downside to these higher densities and smaller devices. For example, smaller devices can only withstand a limited voltage before oxide breakdown occurs. Also, higher densities can result in an increase in power supply dissipation per unit area of an integrated circuit, which can limit operability and lifetime (as measure in mean time before failure) of the circuit. To mitigate both these consequences, the power supply voltages of integrated circuits has been progressively lowered over the years, from 5 volts to 3.3, then to 2.5 and recently 1.8 volts and even lower.

Not all integrated circuits operate at these lower voltages, however. That is, many devices have been designed to operate at 3.3 volts, 5.0 volts, or at even higher voltages. This means that some integrated circuits operating at a lower 1.5 or 1.8 supply voltage need to accept input signals having higher voltages. For example, a device operating with core or internal voltage supplies of 1.8 volts and ground may need to receive signals that switch between 5.0 volts and ground.

This arrangement leads to over-voltage problems for output drivers, input receivers, and input/output (I/O) cells. For example, when receiving an input signal, if the received voltage exceeds the gate-oxide breakdown voltage of the input devices, the devices may become stressed and damaged.

Thus what is needed are circuits, methods, and apparatus for protecting the devices in input and output structures from input voltages that exceed the device's oxide breakdown voltage.

SUMMARY

Accordingly, embodiments of the present invention provide circuits, methods, and apparatus for limiting voltages received by devices in input/output cells to less than the device's breakdown voltage. An exemplary embodiment of the present invention provides an input/output cell having one or more clamp diodes and resistors configured to limit voltages seen by the gates of the devices in the input/output cell. In one embodiment, the clamp diodes are on-chip, while the resistors are off-chip. In a specific embodiment, a clamp diode is connected between an input pad for the input output cell and a supply voltage VCC, while a resistor is off-chip and in series with the input pad. In another specific embodiment, a series of clamp diodes are coupled between ground and an input pad, while a resistor is off-chip and in series with the input pad. In another embodiment, the clamp diode or diodes may be programmably or selectively disconnected. These clamp diodes may be disabled to protect against latch-up. Integrated circuits that are consistent with the present invention may include one or more of these and the other features described.

Embodiments of the present invention allow these input/output cells to interface with signals having voltages that would otherwise be higher than their devices' oxide-breakdown voltage. This allows integrated circuits, such as field programmable gate arrays or programmable logic devices to be manufactured using advanced processes that are not compliant with the higher voltages. These embodiments also save die area while preserving AC transient performance.

A better understanding of the nature and advantages of the present invention may be gained with reference to the following detailed description and the accompanying drawings.

DESCRIPTION OF EXEMPLARY EMBODIMENTS

Figure 1:
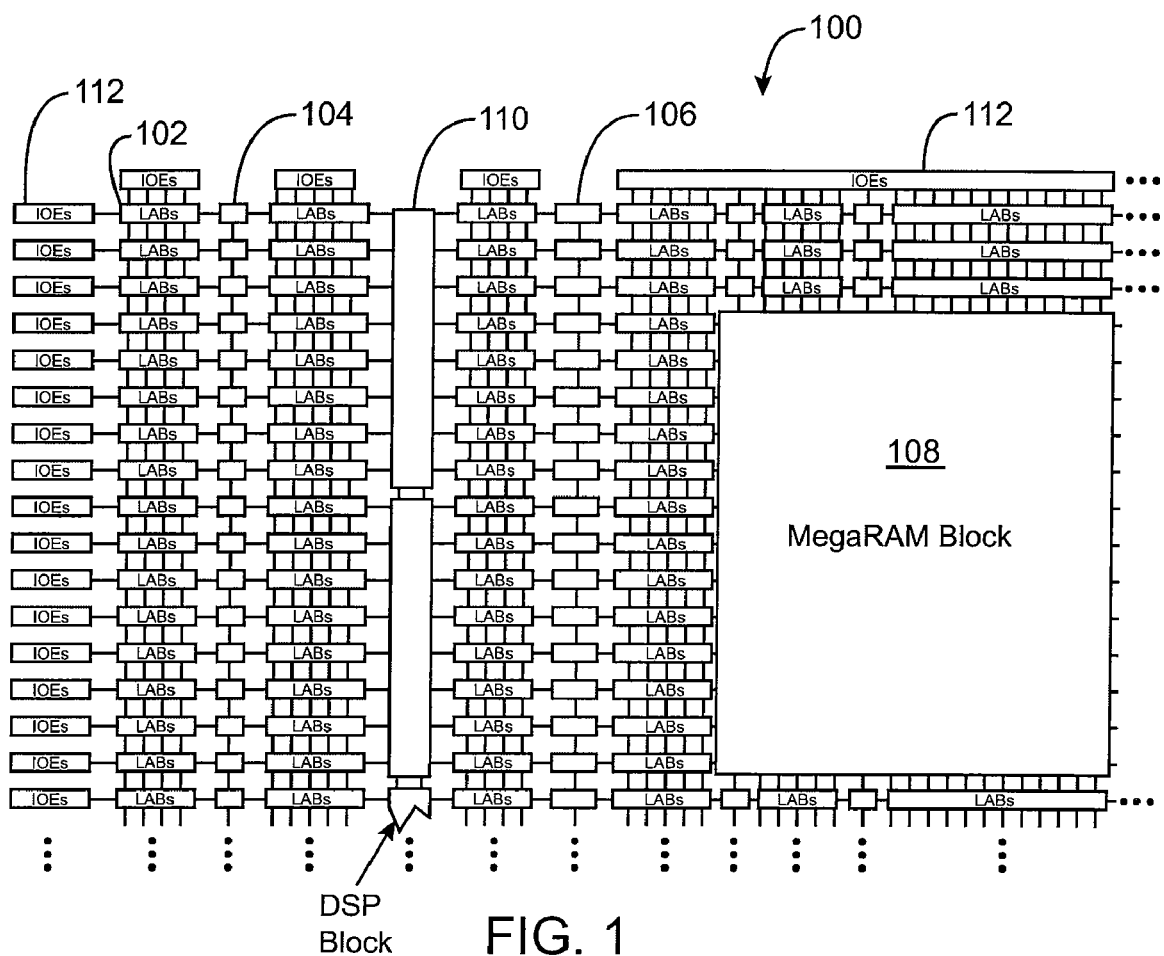
FIG. 1 is a simplified block diagram of a programmable logic device that can implement embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnects of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and a M-Block 108 providing 512K bits of RAM. These memory blocks may also include shift registers and FIFO buffers. PLD 100 further includes digital signal processing (DSP) blocks 110 that can implement, for example, multipliers with add or subtract features. I/O elements (IOEs) 112 located, in this example, around the periphery of the device support numerous single-ended and differential I/O standards. These I/O elements or input/output cells 112 may be improved by incorporating embodiments of the present invention. It is to be understood that PLD 100 is described herein for illustrative purposes only and that the present invention can be implemented in many different types of PLDs, FPGAs, and the like.

Figure 2:
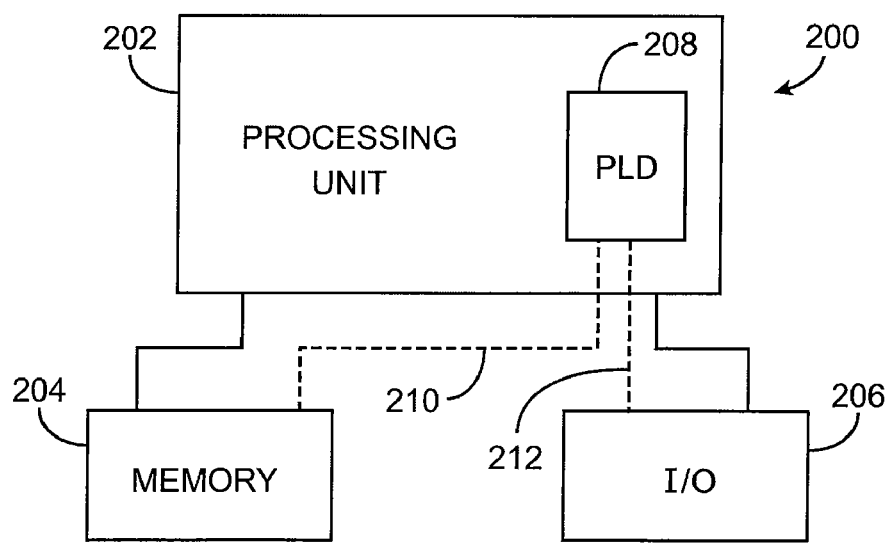
FIG. 2 is a block diagram of an electronic system that may incorporate embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
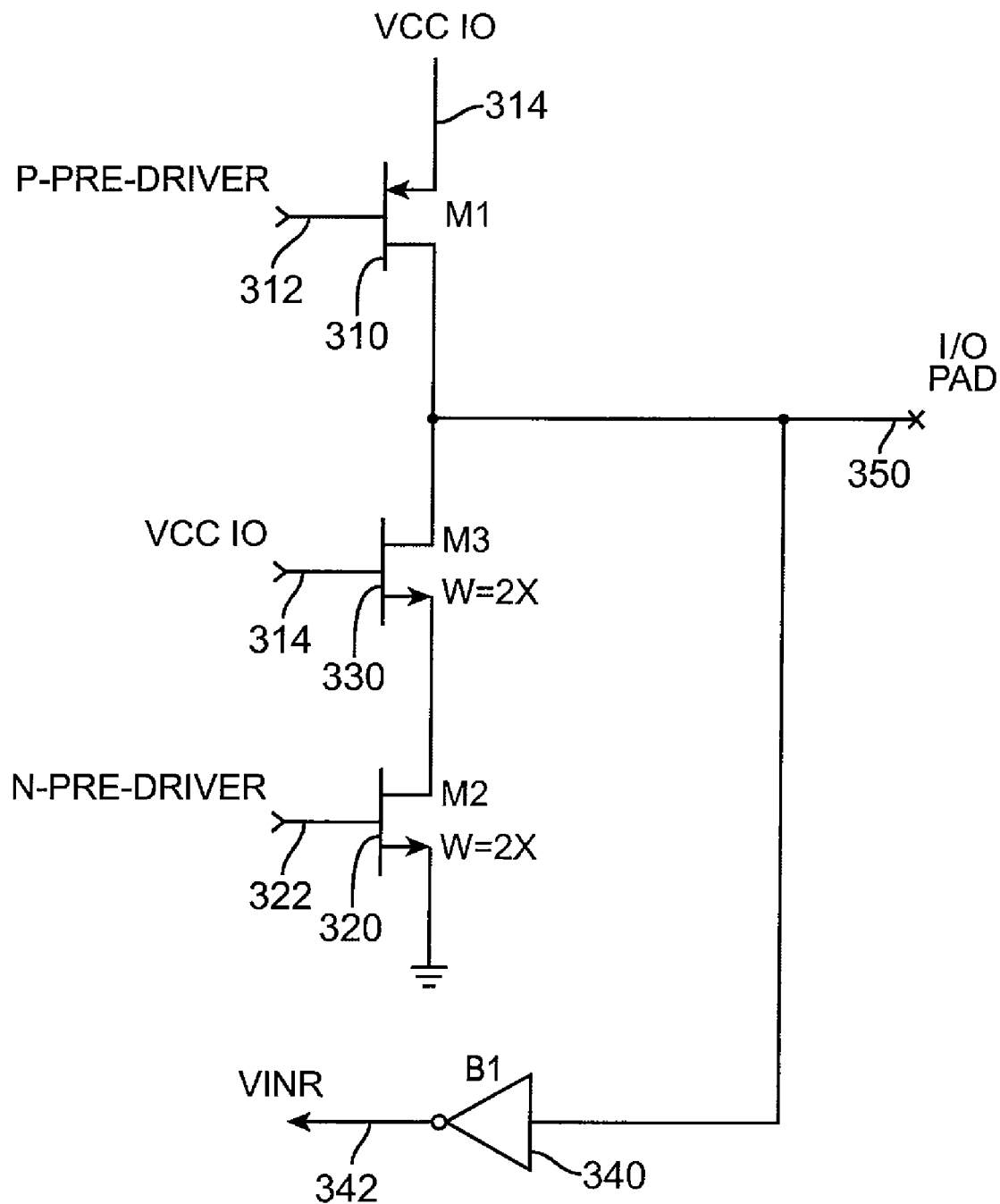
FIG. 3 is a simplified schematic of a conventional input/output cell including a driver that uses a stacked device to stand-off high input voltages.

FIG. 3 is a simplified schematic of a conventional input/output cell including a driver that uses a stacked device to stand-off high input voltages. This input/output cell includes a pull-up device M1 310, pull-down device M2 320, cascode device M3 330, and input gate or buffer B1 340. This cell can operate in an input or receive mode where signals are received on pad 350, and in an output or transmit mode where signals are either provided on pad 350, or the output drivers are tristated such that other devices can provide a signal on a line connected to pad 350.

Specifically, in the input mode, signals are received at the pad 350 by the input buffer 340, which provides an output signal VINR on line 342. Also in this mode, the p-predriver input signal on line 312 is high, while the n-predriver input signal on line 320 is low, thus shutting their devices off and providing a high impedance at the pad 350.

In the output mode, signals are received on the p-predriver line 312 by M1 310 and the n-predriver line 314 by M2 320. The output devices provide low impedance paths either to VCCIO on line 314 or ground. Also in the output mode, this structure may be tristated by shutting off M1 310 and M2 320, as is done in the input mode. In this way, the pad 350 may be connected to a line in a tristate bus.

In the input mode, and in the output mode when the output is tristated and connected to a tristate bus, this input/output cell is susceptible to high voltages on the pad 350. Specifically, voltages on pad 350 that exceed the oxide-breakdown voltages of the output devices and devices in the input buffer 340 cause excess input currents and possibly damage to those devices. In particular, the thin gate oxide over the channel may break down due to excessive input voltages.

To mitigate this problem, the cascode or stacked device M3 320 is included. The gate of M3 320 is biased to the supply voltage VCCIO on line 314. This allows the gate of M3 330 to share part of the excess input voltage with M2 320, thus protecting them both. For example, it is common for the voltage applied on line or terminal VCCIO 314 to equal 3.3 volts, while the oxide-breakdown voltage is 4.1 volts. In this case, if an input voltage of 5.0 volts is received, the gate oxide voltage of M3 330 is equal to 1.7 volts (5.0 volts less 3.3 volts) while the gate oxide voltage of M2 320 is equal to 3.3 volts. Thus, both gate oxides are protected from voltages that are higher than their breakdown voltages of 4.1 volts. The p-channel pull-up device 310 has its highest gate-oxide voltage when the voltage on pad 350 is ground. At that time, its gate oxide voltage is 3.3 volts.

Unfortunately, the stacked device M3 330 does not protect the oxides of the input devices in the input buffer B1 340. Further, the addition of M3 330 consumes die area that may be considerable, as these output devices tend to be quite large. Further, to preserve AC performance, the devices M3 330 and M2 320 need to be on the order of at least twice the size they would be without the addition of M3 330. Even with this increase in size, AC performance typically suffers due to the extra capacitance caused by the increased device size that is seen at the pad 350.

Figure 4:
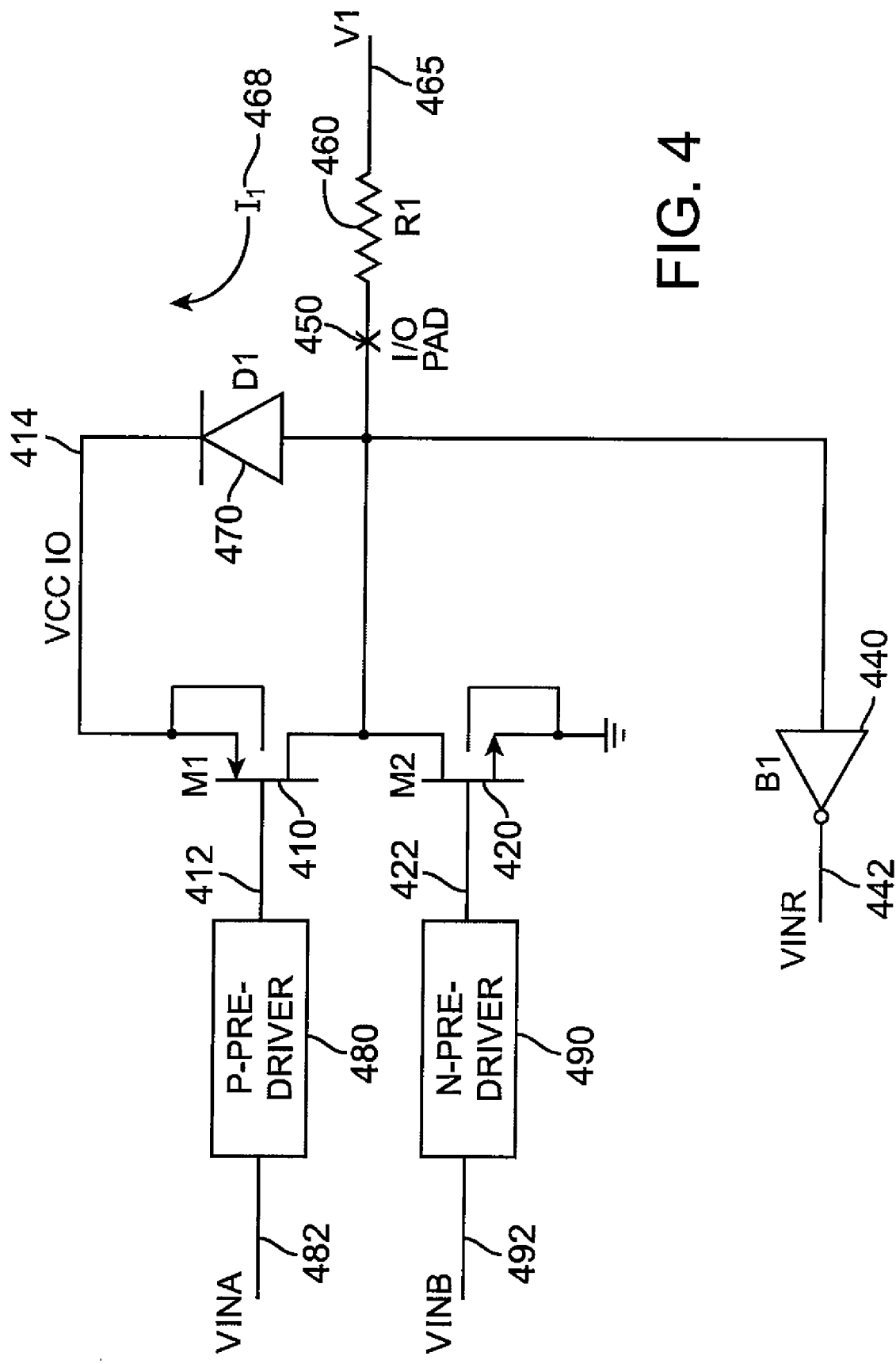
FIG. 4 is a schematic of an input/output cell that is consistent with an embodiment of the present invention.

FIG. 4 is a schematic of an input/output cell that is consistent with an embodiment of the present invention. This figure, as with the other included figures, is shown for illustrative purposes only and does not limit either the possible embodiments of the present invention or the claims.

This input output cell includes a p-channel pull-up device M1 410, n-channel pull-down device M2 420, input buffer or receiver B1 440, p-channel predriver circuit 480, n-channel predriver circuit 490, and an input clamp circuit including resistor R1 460 and diode D1 470. This input/output cell can operate in an input or receive mode where signals are received on pad 450, and in an output or transmit mode where signals are either provided on pad 450, or the output drivers are tristated such that other devices can provide signal on a line connected to pad 450.

Specifically, in the input mode, a signal V1 on line 465 is received the resistor R1 460, which is connected to the pad 450. Typically, the input/output cell shown is formed on a first integrated circuit, while the signal V1 on line 465 is provided by a second integrated circuit. The signal at the pad 450 is received by the input buffer 440, which provides an output signal VINR on line 442. Also in this mode, the p-predriver 480 provides a high or "one" level signal on line 412 to the gate of M1 410, while the n-predriver 490 provides a low or "zero" level signal on line 422 to the gate of M2 420, thus shutting those devices off and providing a high impedance at the pad 450.

In the output mode, signals VINA on line 482 and VINB on line 492 (these may be the same signal) are received on the p-predriver 480 and the n-predriver 480. These signals may be generated by a logic element, such as a logic element in a logic array block 102, for example, in a core of a field programmable gate array device. The predrivers 480 and 490 provide signals to the gates of M1 410 and M2 420. To improve performance, one or more of the predrivers 480 and 490, and the other predrivers in the other included examples, may operate at a higher supply, as is shown in co-pending U.S. patent application Ser. No. 10/794,987 titled "High Speed IO Buffer Using Auxiliary Power Supply", by Nguyen et al., which is incorporated by reference. The output devices provide low-impedance paths from the pad 450 to either VCCIO on line 414 or ground. Also in the output mode, this structure may be tristated (placed in a high impedance mode) by shutting off M1 410 and M2 420, as is done in the input mode. In this way, the pad 450 may be connected to a line in a tristate bus.

The clamp circuit including resistor R1 460 and diode D1 470 limits the voltage seen by the gate oxide of devices M2 420 and the input devices of B1 440 to a voltage that is equal to the supply of voltage VCCIO on line 314 plus a diode drop. If the voltage of signal V1 on line 465 is excessive, it generates a current I1 468 through R1 460 and diode D1 470, such that the resistor R1 460 absorbs part of the excess voltage, thus protecting the devices in the input/output cell.

Again, it is common for the supply of voltage VCCIO on line 414 to be equal to 3.3 volts, while the oxide breakdown voltages of the devices is equal to 4.1 volts. In this case, if the input signal V1 on line 465 is equal to 5 volts, a current is developed through the resistor R1 460 and diode D1 470. Specifically, diode D1 470 conducts current and clamps the voltage at pad 450 to a voltage that is equal to the supply voltage VCCIO on line 414 plus a diode drop, or 3.3 volts plus 0.7 volts, which is equal to 4.0 volts. Accordingly, a voltage of 1 volt (5 volts less 4 volts) is dropped across R1 460. In this way, R1 460 reduces the input voltage V1 on line 465 to a lower voltage at the pad 450, thus protecting device M2 420 and the devices in B1 440.

In the example above, one volt is dropped across R1 460. Accordingly, care should be taken in selecting the value of the resistor R1 460 such that large input currents are not required by output drivers on integrated circuits providing the signal V1 on line 465. In a specific embodiment of the present invention, a resistor having a value of 1 k ohm is used, resulting in a current of 1 mA through resistor R1 460 and diode D1 470.

In other embodiments, care should be taken to avoid exceeding the $I_{OH}$ specification for the circuit providing the voltage V1 on line 465. For example, if the supply voltage VCCIO on line 414 is nominally 3.3 volts while the circuit providing V1 on line 465 is nominally 5 volts and has an $I_{OH}$ specification of 8 mA, then given a 10 percent supply tolerance for each supply voltage, R1 460 can be found by the equation:

$$R1=(V1\max-VCCIO\min-V\text{diode})/I_{OH}=(5.5-3.0-0.7)/8\text{ mA}=225\text{ ohms},$$

where V1max is the maximum supply voltage for the device providing V1 on line 465, VCCIOmin is the minimum voltage for VCCIO on line 414, and Vdiode is the diode voltage for diode D1 470.

Further refinement may be made to the calculation of R1 by estimating the output impedance of the driving circuit that provides V1 on line 465. For example, curves showing $I_{OH}$ as a function of output voltage may be available from the circuit manufacturer. If this data is available, the output impedance may be modeled by dividing the voltage across the output (the supply voltage) by the $I_{OH}$ at zero volts output. That number may be used to adjust R1 using the following equation:

$$R1=[(V1\max-VCCIO\min-V\text{diode})-(Rd\times I_{OH})]/I_{OH},$$

where Rd is the output impendence of the circuit providing the voltage V1 on line 465.

For example, if Rd is determined to be 30 ohms, R1 is found to be:

$$R1=[(5.5-3.0-0.7)-(30\times8\text{ m})]/8\text{ m}=195\text{ ohms}.$$

In short, the 30 ohms determined to be the output impedance of the circuit providing V1 on line 465 is subtracted from the result of 225 ohms found above. In this way, R1 can be adjusted to limit the output current of the driving circuit that provides V1 on line 465, while allowing fast rise and fall times at the pad 450.

In various embodiments of the present invention, different diodes D1 470 may be used. For example, this diode may be a p/n diode where a p-type region forms the anode and an n-type region forms the cathode, a Schottky diode where an n-region forms the cathode and a metal layer forms anode, or other types of diode structures. For example, this diode may be an npn or a pnp device having its base tied to its collector, or a p-channel or n-channel MOS device having its source tied to its gate. If an npn is used, the anode is the collector and base, while the cathode is the emitter. If a pnp is used, the anode is the emitter, while the cathode is the base and collector. If an n-channel device is used, the cathode is the source, while the anode is the gate and drain. If a p-channel device is used, the cathode is the gate and drain, while the cathode is the source.

Also, this diode is in parallel with a drain-to-bulk diode of M1 410. Accordingly, care should be taken that the current provided by R1 460 does not damage the diode in M1 410. In some embodiments of the present invention, the drain-to-bulk diode of M1 410 is used as the diode D1 470. In this specific example, the bulk of M1 410 is tied to its source. In other embodiments of the present invention, alternate biasing schemes for the well of M1 410 may be used, such as those found in co-pending U.S. patent application Ser. No. 10/794, 987 titled "High Speed IO Buffer Using Auxiliary Power Supply", by Nguyen et al.

In this specific example, the clamp circuit including R1 460 and D1 470, is shown as protecting both an input structure and an output structure. In other embodiments of the present invention, clamp circuits consistent with embodiments of the present invention are used to protect an input circuit or an output circuit alone. Also, if this cell is connected to a tristate bus, not all drivers on the tristate bus may be capable of generating excess voltages. In that case, those drivers may connect to the pad 450 directly, while other drivers that may provide excess voltages are connected to the pad 450 through the resistor R1 460. In the case of multiple drivers that may generate excess voltages, the resistor R1 460 may be shared, or each output may have its own.

Also in this specific example, a positive voltage VCCIO is shown as applied to line 414, while the source of device M2 428 shown as being grounded. It will be appreciated by one skilled in the art that other supply voltage schemes may be used. For example, the circuit may operate between ground and a negative voltage, or between a positive voltage and a negative voltage. Alternately, other power supply schemes may be used. Also, in this and other examples, the devices shown are CMOS devices. In other embodiments of the present invention, other types of devices, such as bipolar, BiCMOS, HBT, HFET, and other type of devices may be used. Other specific embodiments operate at 3.3 Volts, while others operate at 2.5 Volts or lower.

The resistor R1 460 is shown in this example as being off-chip, that is, it is connected between the pad 460 and a signal line V1 465. In other embodiments of the present invention, the resistor R1 460 may be included on the integrated circuit that includes the input/output cell. In other embodiments of the present invention, the resistor R1 460 may be included on the integrated circuit that generates the voltage V1 465. Resistor R1 460 may be formed by a resistor, it may be the resistance of a printed circuit board trace, or it may be some other form of resistance.

If the resistor R1 470 is on-chip, and the cell includes both input and output circuitry, a clamp circuit consistent with an embodiment of the present invention may be used to protect either or both the input and output circuits. For example, a clamp circuit consistent with an embodiment of the present invention may be used to protect the input cell, while other techniques are used to protect the output circuitry. In this configuration, the resistor R1 460 is removed from the output transient path. Also, voltage drops associated with the resistor R1 460 are removed from the output.

Figure 5:
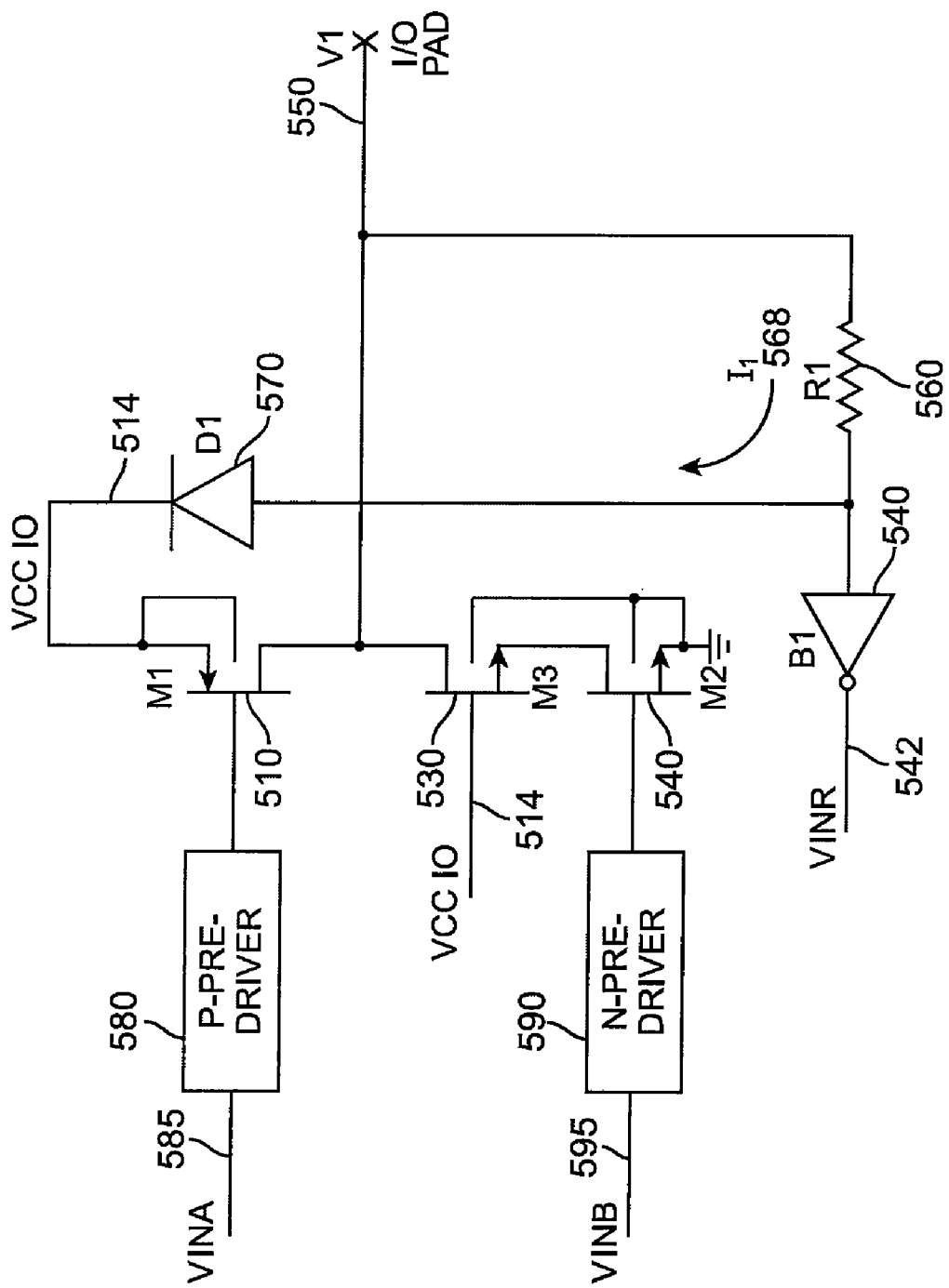
FIG. 5 is a schematic of another input/output cell that is consistent with an embodiment of the present invention.

FIG. 5 illustrates an input/output cell were a clamp circuit consistent with embodiment of the present invention is used to protect an input structure, while a conventional technique is used to protect the output structure. This input/output cell includes a p-channel pull-up device M1 510, n-channel pull-down device M2 520, n-channel cascode device M3 530, input buffer or receiver B1 540, p-channel predriver circuit 580, n-channel predriver circuit 590, and an input clamp circuit including resistor R1 560 and diode D1 570. This input/output cell can operate in an input or receive mode where signals are received on pad 550, and in an output or transmit mode where signals are either provided on pad 550, or the output drivers are tristated such that other devices can provide signal on a line connected to pad 550.

Specifically, in the input mode, a signal V1 received at the pad 550. Typically, the input/output cell shown is formed on a first integrated circuit, while the signal V1 at the pad 550 is provided by a second integrated circuit. The signal V1 at the pad 550 is received at one terminal of the resistor 560, the other terminal of which is connected to the input buffer 540. The input buffer provides an output signal VINR on line 542. Also in this mode, the p-predriver 580 provides a high or "one" level signal on line 512 to the gate of M1 510, while the n-predriver 590 provides a low or "zero" level signal on line 522 to the gate of M2 520, thus shutting those devices off and providing a high impedance at the pad 550.

In the output mode, signals VINA on line 582 and VINB on line 592 (again, these may be the same signal) are received on the p-predriver 580 and the n-predriver 580. These signals may be generated by a logic element, such as a logic element in a logic array block 102, for example, in a core of a field programmable gate array device. The predrivers 580 and 590 provide signals to the gates of M1 510 and M2 520. The output devices provide low-impedance paths from the pad 550 to either VCCIO on line 514 or ground. Also in the output mode, this structure may be tristated by shutting off M1 510 and M2 520, as is done in the input mode. In this way, the pad 550 may be connected to a line in a tristate bus.

The clamp circuit including resistor R1 560 and diode D1 570 limits the voltage seen by the gate oxide of devices in the input buffer B1 540 to a voltage that is equal to the supply of voltage VCCIO on line 514 plus a diode drop. If the voltage of signal V1 on line 565 is excessive, it generates a current I1 568 through R1 560 and diode D1 570, such that the resistor R1 560 absorbs part of the excess voltage, thus protecting the devices in the input/output cell.

As before, it is common for the supply of voltage VCCIO on line 514 to be equal to 3.3 volts, while the oxide breakdown voltages of the devices is equal to 4.1 volts. In this case, if the input signal V1 at the pad 550 is equal to 5 volts, a current is developed through the resistor R1 560 and diode D1 570. Specifically, diode D1 570 conducts current and clamps the voltage at pad 550 to a voltage that is equal to the supply voltage VCCIO on line 514 plus a diode drop, or 3.3 volts plus 0.7 volts, which is equal to 4.0 volts. As before, a voltage of 1 volt (5 volts less 4 volts) is dropped across R1 560. In this way, R1 560 reduces the input voltage V1 at the pad 550 to a lower voltage at the input of the buffer B1 540, thus its input devices. As before, the cascode device M3 530 protects the p-channel pull-down device M2 520.

Depending on the size of R1 460 and R 560 in the previous examples, the supply voltage VCCIO on line 414 and 514 may need to sink an amount of transient current that may cause a glitch or other power supply disturbance. For example, a circuit providing VCCIO may come out of regulation. Also, VCCIO may be close to the gate oxide breakdown voltage such that clamping to VCCIO plus a diode drop does not adequately protect the gate oxide of the input/output devices. For these and other reasons, it may be desirable to clamp the excess received voltages to ground.

Figure 6:
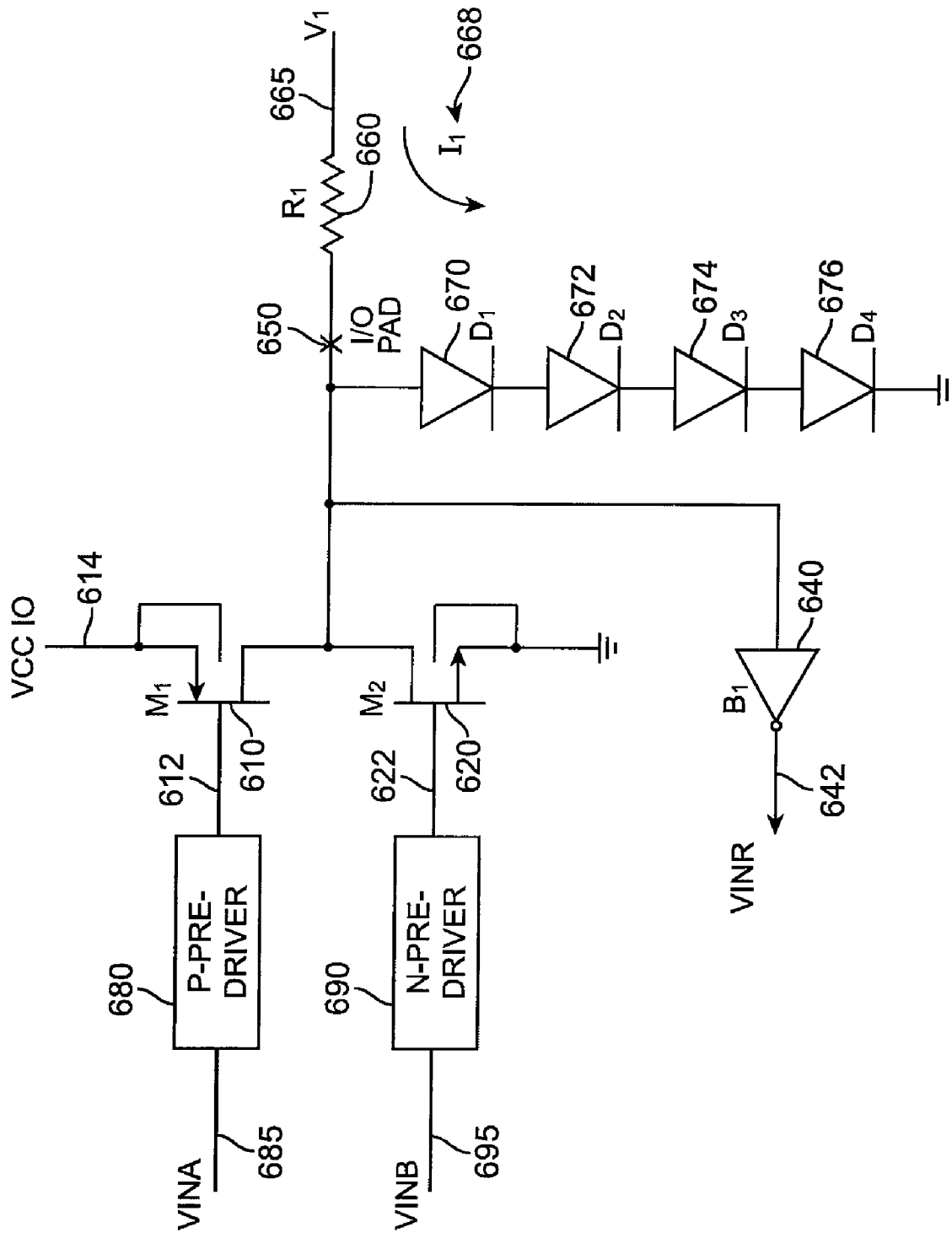
FIG. 6 is a schematic of yet another input/output cell that is consistent with an embodiment of the present invention.

FIG. 6 illustrates a schematic of an input/output cell consistent with an embodiment of the present invention where the clamp circuit is connected between an input signal line and ground. This input output cell includes a p-channel pull-up device M1 610, n-channel pull-down device M2 620, input buffer or receiver B1 640, p-channel predriver circuit 680, n-channel predriver circuit 690, and an input clamp circuit including resistor R1 660 and diodes D1 670, D2 672, D3 674, and D4 676. In this specific example, four diodes are shown in series, with the anode of a first diode in the series connected to the pad, while a cathode of a last diode in the series is connected to ground. In other embodiments of the present invention, there may be other numbers of diodes in series. Alternately, other diodes or configurations, such as a zener diode, or a diode multiplier may be used.

This input/output cell can operate in an input or receive mode where signals are received on pad 650, and in an output or transmit mode where signals are either provided on pad 650, or the output drivers are tristated such that other devices can provide signal on a line connected to pad 650.

Specifically, in the input mode, a signal V1 on line 665 is received a terminal of the resistor R1 660, the other terminal of which is connected to the pad 650. Typically, the input/output cell shown is formed on a first integrated circuit, while the signal V1 on line 665 is provided by a second integrated circuit. The signal at the pad 650 is received by the input buffer 640, which provides an output signal VINR on line 642. Also in this mode, the p-predriver 680 provides a high or "one" level signal on line 612 to the gate of M1 610, while the n-predriver 690 provides a low or "zero" level signal on line 622 to the gate of M2 620, thus shutting those devices off and providing a high impedance at the pad 650.

In the output mode, signals VINA on line 682 and VINB on line 692 are received on the p-predriver 680 and the n-predriver 680. The predrivers 680 and 690 provide signals to the gates of M1 610 and M2 620. The output devices provide low-impedance paths from the pad 650 to either VCCIO on line 614 or ground. Also in the output mode, this structure may be tristated by shutting off M1 610 and M2 620, as is done in the input mode. In this way, the pad 650 may be connected to a line in a tristate bus.

The clamp circuit including resistor R1 660 and diodes D1 670, D2 672, D3 674, and D4 676 limit the voltage seen by the gate oxide of devices M2 620 and the input devices of B1 640 to a voltage that is equal to four diode drops above ground. If the voltage of signal V1 on line 665 is excessive, it generates a current I1 668 through R1 660 and diodes D1 670, D2 672, D3 674, and D4 676, such that the resistor R1 660 absorbs part of the excess voltage, thus protecting the devices in the input/output cell.

As before, it is common for the supply of voltage VCCIO on line 614 to be equal to 3.3 volts, while the oxide breakdown voltages of the devices is equal to 4.1 volts. In this case, if the input signal V1 on line 665 is equal to 5 volts, a current is developed through the resistor R1 660 and diodes D1 670, D2 672, D3 674, and D4 676. Specifically, diodes D1 670, D2 672, D3 674, and D4 676 conduct current and clamp the voltage at pad 650 to a voltage that is equal to four diode drops above ground, or 4 time 0.7 volts, which is equal to 2.8 volts. Accordingly, a voltage of 2.2 volts (5 volts less 2.8 volts) is dropped across R1 660. In this way, R1 660 reduces the input voltage V1 on line 665 to a lower voltage at the pad 650, thus protecting device M2 620 and the devices in B1 640.

In the example above, 2.2 volts is dropped across R1 660. As before, care should be taken in selecting the value of the resistor R1 660 such that large input currents are not required by output drivers on integrated circuits providing the signal V1 on line 665. In a specific embodiment of the present invention, a resistor having a value of 1 k ohm is used, resulting in a current of 2.2 mA through resistor R1 660 and diodes D1 670, D2 672, D3 674, and D4 676. Alternately, the value of R1 660 may be determined in a similar manner as above, such that the $I_{OH}$ specification for the driving circuit providing the input voltage V1 on line 665 is not exceeded.

Specifically, R1 can be found by the following equation:

$$R1=(V1\max-NV\text{diode})/IOH,$$

where N is the number of diodes in the diode string D1 610, D2 672, D3 674, and D4 676.

If V1max is 5.5 volts and four diodes are used, then $$R1=(5.5-2.8)/8\text{ mA}=338\text{ ohms}.$$

Again, the output impedance of the source for V1 on line 665 may be subtracted from this value.

Figure 7:
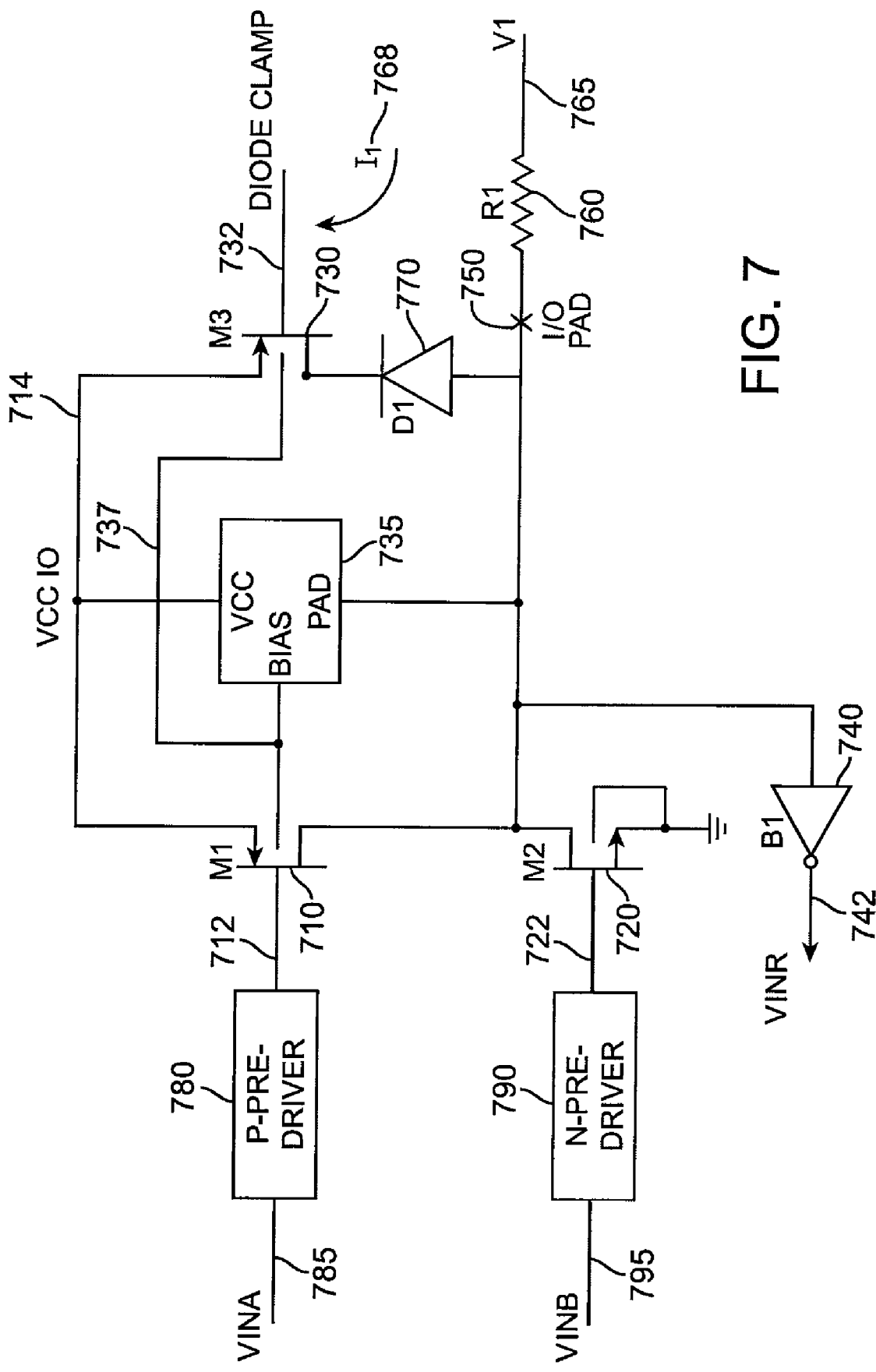
FIG. 7 is a schematic of an input/output cell consistent with an embodiment of the present invention having a hot-socket circuit and a clamp diode that may be programmably or selectively disconnected.

FIG. 7 is a schematic of an input/output cell consistent with an embodiment of the present invention having a hot-socket circuit and a clamp diode that may be programmably or selectively disconnected. This input output cell includes a p-channel pull-up device M1 710, n-channel pull-down device M2 720, input buffer or receiver B1 740, p-channel predriver circuit 780, n-channel predriver circuit 790, an input clamp circuit including resistor R1 760, diode D1 770, and switch M3 730, and a hot-socket circuit 735. In this specific example, one diode D1 770 is shown in series with the switch M3 730, with the anode of diode D1 770 connected to the pad and the cathode connected to the switch M3 770, the other side of which is connected to VCCIO on line 714. In other embodiments of the present invention, there may be other numbers of diodes in series, and the diodes may be selectively connected to ground or other voltage terminal.

This input/output cell can operate in an input or receive mode where signals are received on pad 750, and in an output or transmit mode where signals are either provided on pad 750, or the output drivers are tristated such that other devices can provide signal on a line connected to pad 750.

Specifically, in the input mode, a signal V1 on line 765 is received a terminal of the resistor R1 760, the other terminal of which is connected to the pad 750. Typically, the input/output cell shown is formed on a first integrated circuit, while the signal V1 on line 765 is provided by a second integrated circuit. The signal at the pad 750 is received by the input buffer 740, which provides an output signal VINR on line 742. Also in this mode, the p-predriver 780 provides a high or "one" level signal on line 712 to the gate of M1 710, while the n-predriver 790 provides a low or "zero" level signal on line 722 to the gate of M2 720, thus shutting those devices off and providing a high impedance at the pad 750.

In the output mode, signals VINA on line 782 and VINB on line 792 are received on the p-predriver 780 and the n-predriver 780. The predrivers 780 and 790 provide signals to the gates of M1 710 and M2 720. The output devices provide low-impedance paths from the pad 750 to either VCCIO on line 714 or ground. Also in the output mode, this structure may be tristated by shutting off M1 710 and M2 720, as is done in the input mode. In this way, the pad 750 may be connected to a line in a tristate bus.

The diode D1 770 may be selectively or programmably disconnected from or connected to the VCCIO terminal on line 714. Specifically when the diode clamp signal on line 732 is low, the anode of the diode D1 770 is connected to VCCIO on line 714 through M3 730. When the diode clamp signal on line 732 is high, M3 730 is off, and the diode D1 770 is disconnected from VCCIO on line 714. The clamp diode signal on line 732 may be provided by a configuration bit stored in a memory, such as a flash, EEPROM, ERAM, SRAM, or other memory type. Alternately, the clamp diode signal on line 732 may be provided by a logic gate, such as a logic element 102, it may be an externally supplied voltage, or it may be provided by another signal source.

When the diode D1 770 is connected though switch M3 730 to VCCIO on line 714, the clamp circuit including resistor R1 760, diode D1 770, and M3 730, limits the voltage seen by the gate oxide of devices M2 720 and the input devices of B1 740 to a voltage that is equal to a diode drop above VCCIO on line 714. If the voltage of signal V1 on line 765 is excessive, it generates a current I1 768 through R1 760, diode D1 770, and M3 730, such that the resistor R1 760 absorbs part of the excess voltage, thus protecting the devices in the input/output cell.

As before, it is common for the supply of voltage VCCIO on line 714 to be equal to 3.3 volts, while the oxide breakdown voltages of the devices is equal to 4.1 volts. In this case, if the input signal V1 on line 765 is equal to 5 volts, a current is developed through the resistor R1 760, diode D1 770, and M3 730. Specifically, diode D1 770 and switch M3 730 conduct current and clamp the voltage at pad 750 to a voltage that is equal to a diode drop plus a Vds for the switch M3 730 above VCC, which is typically about 4.0 volts at room temperature. Accordingly, a voltage of 1.0 volts (5 volts less 4.0 volts) is dropped across R1 760. In this way, R1 760 reduces the input voltage V1 on line 765 to a lower voltage at the pad 750, thus protecting device M2 720 and the devices in B1 740.

Again, when the voltage on the 10 pad 750 is above the voltage VCCIO provided on line 714, care should be taken to avoid conduction of the drain-to-well diode in the pull-up device M1 710, unless the pull-up device M1 710 is specifically designed for this purpose. Accordingly, some embodiments of the present invention incorporate a hot-socket circuit 735 that may be used to bias the well of device M1 710. Also, the well of device M3 730 may be biased by this circuit.

The hot-socket circuit 735 tracks the higher voltage between the supply VCCIO on line 714 and the pad 750, and provides that voltage as a bias to the well of devices M1 710 and M3 730. In this way, as the pad voltage exceeds the voltage VCCIO on line 714, the well of device M1 710 is biased such that the voltage across the drain-to-well diode M1 710 is near zero. Examples of well-bias or hot-socket circuits that may be used as the hot-socket circuit 735 may be found in copending U.S. application Ser. No. 10/736,370, titled "OVER-VOLTAGE PROTECTION OF INTEGRATED CIRCUIT I/O PINS," by Reese, which is incorporated by reference.

Figure 8:
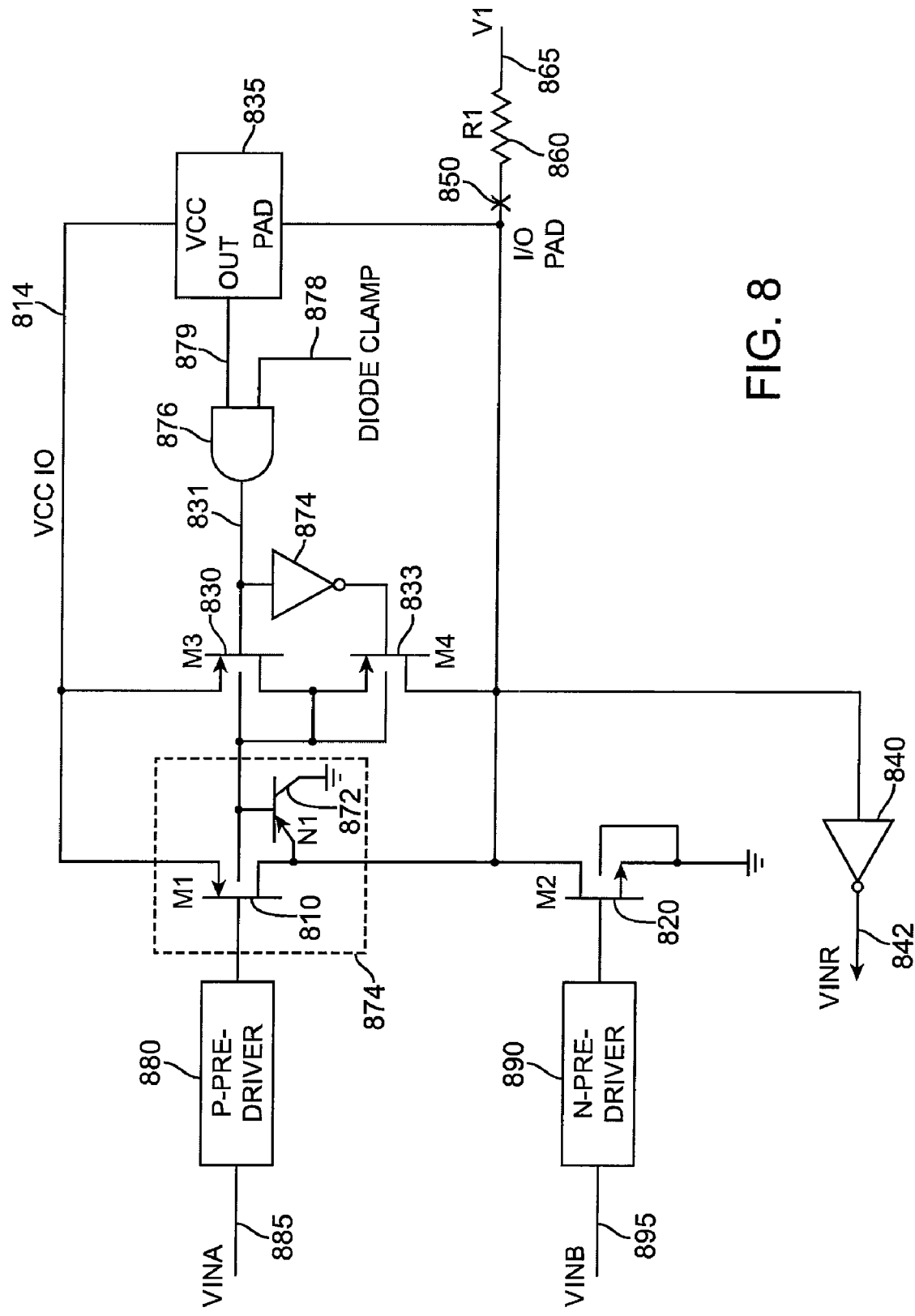
FIG. 8 is a schematic of an input/output cell consistent with an embodiment of the present invention having a hot-socket circuit that may be programmably or selectively overridden to implement a clamp diode.

FIG. 8 is a schematic of an input/output cell consistent with an embodiment of the present invention having a hot-socket circuit that may be programmably or selectively overridden. This input output cell includes a p-channel pull-up device 874 including M1 810 and parasitic pnp 872, n-channel pull-down device M2 820, input buffer or receiver B1 840, p-channel predriver circuit 880, n-channel predriver circuit 890, an input clamp circuit including resistor R1 860, transistor N1 870, and switches M3 830 and M4 833, and hot-socket logic including hot-socket circuit 835, AND gate 876, and inverter 874.

In this specific example, the parasitic transistor N1 872 is shown as pnp device having its base tied to the well of M1 810, its collector to VSS, and its emitter connected to the drain of M1 810. In some embodiments of the present invention, this transistor is a vertical device formed by the drain of M1 810 (the emitter), the substrate (the collector), and the well of M1 810 (the base).

This input/output cell can operate in an input or receive mode where signals are received on pad 850, and in an output or transmit mode where signals are either provided on pad 850, or the output drivers are tristated such that other devices can provide signal on a line connected to pad 850.

Specifically, in the input mode, a signal V1 on line 865 is received a terminal of the resistor R1 860, the other terminal of which is connected to the pad 850. Typically, the input/output cell shown is formed on a first integrated circuit, while the signal V1 on line 865 is provided by a second integrated circuit. The signal at the pad 850 is received by the input buffer 840, which provides an output signal VINR on line 842. Also in this mode, the p-predriver 880 provides a high or "one" level signal on line 812 to the gate of M1 810, while the n-predriver 890 provides a low or "zero" level signal on line 822 to the gate of M2 820, thus shutting those devices off and providing a high impedance at the pad 850.

In the output mode, signals VINA on line 882 and VINB on line 892 are received on the p-predriver 880 and the n-predriver 890. The predrivers 880 and 890 provide signals to the gates of M1 810 and M2 820. The output devices provide low-impedance paths from the pad 850 to either VCCIO on line 814 or ground. Also in the output mode, this structure may be tristated by shutting off M1 810 and M2 820, as is done in the input mode. In this way, the pad 850 may be connected to a line in a tristate bus.

The hot-socket circuit 835 compares the voltage VCCIO on line 814 with the voltage at the IO pad 850, and produces a digital output based on that comparison. In this specific example, if the voltage at the pad 850 is lower than the voltage VCCIO on line 814, the hot-socket circuit provides a low signal on line 879. When this signal is low, the output of the AND gate 876 is low, and thus. M3 830 is conducting. In this case, the well of M1 810 is connected to VCCIO on line 814, while the drain-to-well diode (the emitter of N1 872) acts as a clamp diode in conjunction with the resistor R1 860. In this configuration, the clamp circuit including resistor R1 860 and the emitter of N±872 limit the voltage seen by the gate oxide of devices M2 820 and the input devices of B1 840 to a voltage that is equal to a diode drop above VCCIO on line 814.

In this specific example, when the voltage on the pad 835 is higher than the voltage VCCIO on line 814, the hot-socket circuit 835 provides a high signal on line 879. In that case, if the diode clamp signal on line 878 is also high, the output of inverter 874 is low, and thus M4 833 is conducting. In this configuration, the pad is connected though M4 833 to the well of M1 810. In this way, as the pad voltage rises, the well of M1 810 tracks the increase. This prevents base currents in transistor N1 872, which can lead to substrate currents that can cause the circuit to latch-up.

In this particular embodiment of the present invention, the clamp current in N1 872 is split between its base-emitter junction and emitter-collector based on the devices beta or current gain. An excess amount of collector current may lead to a catastrophic latch-up event. In the embodiment shown in FIG. 7, an independent diode is implemented, thus increasing the immunity to latch-up during hot-socket events and normal operations. The hot-socket circuit 735 remains active during hot-socket events, thus protecting devices M1 710 and M3 730 from parasitic latch-up.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a pull-up MOS transistor having a source terminal coupled to a first supply voltage and a drain terminal coupled to an input/output pad;
   a pull-down MOS transistor having a drain terminal coupled to the input/output pad and a source terminal coupled to a second supply voltage that is lower than the first supply voltage;
   a first MOS transistor having a source terminal coupled to the first supply voltage and a bulk terminal coupled to the bulk terminal of the pull-up MOS transistor;
   an active diode having a first terminal coupled to the drain terminal of the first MOS transistor, and a second terminal coupled to the input/output pad; and
   a biasing circuit coupled between the input/out pad and the first supply voltage and adapted to apply to bulk terminals of the pull-up MOS transistor and the first MOS transistor the higher of a voltage applied to the input/output pad and the first supply voltage.

2. The integrated circuit of claim 1 further comprising: an input buffer coupled directly to the input/output pad.

3. The electronic circuit of claim 1 further comprising:
   a first predriver circuit coupled to a gate terminal of the pull-up MOS transistor; and
   a second predriver circuit coupled to a gate terminal of the pull-down MOS transistor.

4. An electronic system comprising:
   an integrated circuit comprising:
      a pull-up MOS transistor having a source terminal coupled to a first supply voltage and a drain terminal coupled to an input/output pad;
      a pull-down MOS transistor having a drain terminal coupled to the input/output pad and a source terminal coupled to a second supply voltage that is lower than the first supply voltage;
      a clamp MOS transistor having a source terminal coupled to the first supply voltage, a bulk terminal coupled to the bulk terminal of the pull-up MOS transistor, and a gate terminal receiving a control signal;
      a diode having a first terminal coupled to the drain terminal of the clamp MOS transistor, and a second terminal coupled to the input/output pad;
      a biasing circuit coupled between the input/out pad and the first supply voltage and adapted to provide to the bulk terminals of the pull-up MOS transistor and the clamp MOS transistor the higher of a voltage applied to the input/output pad and the first supply voltage; and
   a resistor external to the integrated circuit.

* * * * *